United States Patent
Petruzzello et al.

(10) Patent No.: US 6,191,453 B1
(45) Date of Patent: Feb. 20, 2001

(54) LATERAL INSULATED-GATE BIPOLAR TRANSISTOR (LIGBT) DEVICE IN SILICON-ON-INSULATOR (SOI) TECHNOLOGY

(75) Inventors: John Petruzzello, Carmel; Theodore Letavic, Putnam Valley, both of NY (US); J. Van Zwol, Beek-Ubbergen (NL)

(73) Assignee: Philips Electronics North America Corporation, New York, NY (US)

( * ) Notice: Under 35 U.S.C. 154(b), the term of this patent shall be extended for 0 days.

(21) Appl. No.: 09/459,628

(22) Filed: Dec. 13, 1999

(51) Int. Cl.$^7$ .......................... H01L 29/76; H01L 29/94; H01L 31/062; H01L 31/113; H01L 27/01
(52) U.S. Cl. .......................... 257/350; 257/378; 257/401
(58) Field of Search ............................... 257/57, 66, 347, 257/350, 370, 401

(56) References Cited

U.S. PATENT DOCUMENTS

| | | | |
|---|---|---|---|
| 4,963,951 | 10/1990 | Adler et al. | 357/23.7 |
| 5,362,979 | * 11/1994 | Merchant | 257/340 |
| 5,559,348 | * 9/1996 | Watabe et al. | 257/141 |
| 5,654,561 | 8/1997 | Watabe | 257/139 |
| 5,780,900 | * 7/1998 | Suzuki et al. | 257/335 |
| 5,869,850 | 2/1999 | Endo et al. | 257/139 |
| 6,064,086 | * 5/2000 | Nakagawa et al. | 257/336 |

* cited by examiner

Primary Examiner—Ngân V. Ngô
(74) Attorney, Agent, or Firm—Steven R. Biren

(57) ABSTRACT

A lateral thin-film Silicon-On-Insulator (SOI) device includes a semiconductor substrate, a buried insulating layer on the substrate and a Lateral Insulated Gate Bipolar Transistor (LIGBT) device in an SOI layer on the buried insulating layer and having a source region of a first conductivity type formed in a body region of a second conductivity type opposite to that of the first and a body contact region of the second conductivity type in the body region and connected to the source region. A lateral drift region of a first conductivity type is provided adjacent the body region and forms a lightly-doped drain region, and a drain contact region of the first conductivity type is provided laterally spaced apart from the body region by the drift region with an anode region of the second conductivity type in the drain region and connected to the drain contact region. A gate electrode is provided over a part of the body region in which a channel region is formed during operation and extending over a part of the lateral drift region adjacent the body region, with the gate electrode being at least substantially insulated from the body region and drift region by a surface insulation region. Improved device performance is achieved by making a dimension of the source region in a direction normal to a direction of current flow between the source region and the drain contact region greater than a corresponding dimension of the drain contact region and of the anode region.

5 Claims, 2 Drawing Sheets

LATERAL INSULATED-GATE BIPOLAR TRANSISTOR (LIGBT) DEVICE IN SILICON-ON-INSULATOR (SOI) TECHNOLOGY

BACKGROUND OF THE INVENTION

The invention is in the field of Semiconductor-On-Insulator (SOI) devices, and relates more particularly to Lateral Insulated Gate Bipolar Transition (LIGBT) SOI devices suitable for high-voltage applications.

In fabricating high-voltage power devices, tradeoffs and compromises must typically be made in areas such as breakdown voltage, size, "on" resistance, saturation current and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks. One particularly advantageous form of lateral thin-film SOI device includes a semiconductor substrate, a buried insulating layer on the substrate, and a lateral transistor device in an SOI layer on the buried insulating layer, the device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom by a surface insulation region, a lightly-doped lateral region such as a linearly-graded lateral drift region of the first conductivity type, and a drain region of the first conductivity type laterally spaced apart from the channel region by the drift region.

However, SOI MOSFET devices such as those described above still suffer from certain drawbacks, such as requiring a relatively large area for a given current carrying capacity and high "on" resistance in smaller-area devices. In order to overcome these disadvantages, various types of Lateral Insulated-Gate Bipolar Transistor (LIGBT) designs have been developed, as illustrated in U.S. Pat. Nos. 4,963,951, 5,654,561 and 5,869,850. Although these prior-art LIGBT designs generally offer the advantages of improved current capacity and have various features to improve immunity to latch-up, further improvement in on-state performance (saturation current) would be desirable in order to further increase current capacity and/or reduce device area for a given saturation current value.

Thus, it will be apparent that numerous techniques and approaches have been used in order to enhance the performance of power semiconductor devices, in an ongoing effort to attain a more nearly optimum combination of such parameters as breakdown voltage, size, saturation current and manufacturing ease. While the foregoing structures provide varying levels of improvement in device performance, no one device or structure fully optimizes all of the design requirements for high-voltage, high-current operation.

Accordingly, it would be desirable to have an LIGBT SOI device structure capable of high performance in a high-voltage, high-current environment, in which operating and fabrication parameters, and in particular on-state performance (saturation current) and/or reduced area are further optimized.

SUMMARY OF THE INVENTION

It is therefore an object of the present invention to provide an LIGBT SOI device structure capable of high performance in a high-voltage, high-current environment. It is a further object of the invention to provide such a transistor device structure in which operating and fabrication parameters such as on-state performance and/or reduced area are enhanced.

In accordance with the invention, these objects are achieved in an LIGBT SOI device structure of the general type described above in which a body contact region of the second conductivity type is provided in the body region and adjacent to the source region, an anode region of the second conductivity type is provided in the drain region and connected to the drain contact region, and in which a dimension of the source region in a direction normal to a direction of current flow between the source region and the drain contact region is greater than a corresponding dimension of the drain contact region and of the anode region.

In a preferred embodiment of the invention, the drain contact region, the anode region and the source region form closed concentric regions centered about the drain contact region. In a particularly advantageous configuration, these closed concentric regions will be circular-shaped regions.

In a further preferred embodiment of the invention, a plurality of such LIGBT devices are formed adjacent to each other in the SOI layer and are connected in parallel.

LIGBT SOI devices in accordance with the present invention thus offer a significant improvement in that a combination of favorable performance and fabrication characteristics making the devices suitable for operation in a high-voltage, high-current environment, and in particular improved on-state performance (saturation current) and/or reduced device area, can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
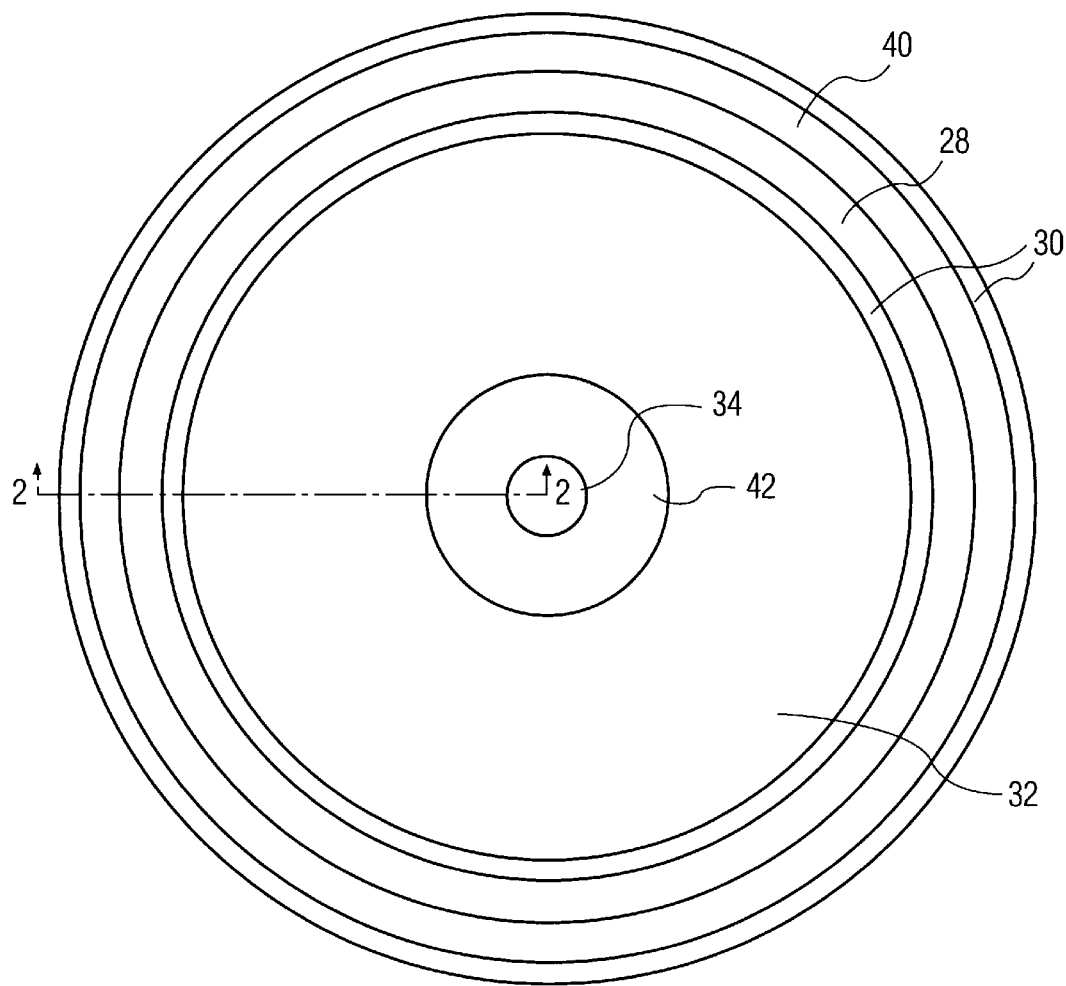
FIG. 1 shows a simplified plan view of an SOI LIGBT device in accordance with a preferred embodiment of the invention.

In the drawing, semiconductor regions having the same conductivity type are generally shown hatched in the same direction in the cross-sectional view, and it should be understood that the figures are not drawn to scale.

DESCRIPTION OF THE PREFERRED EMBODIMENTS

Figure 2:
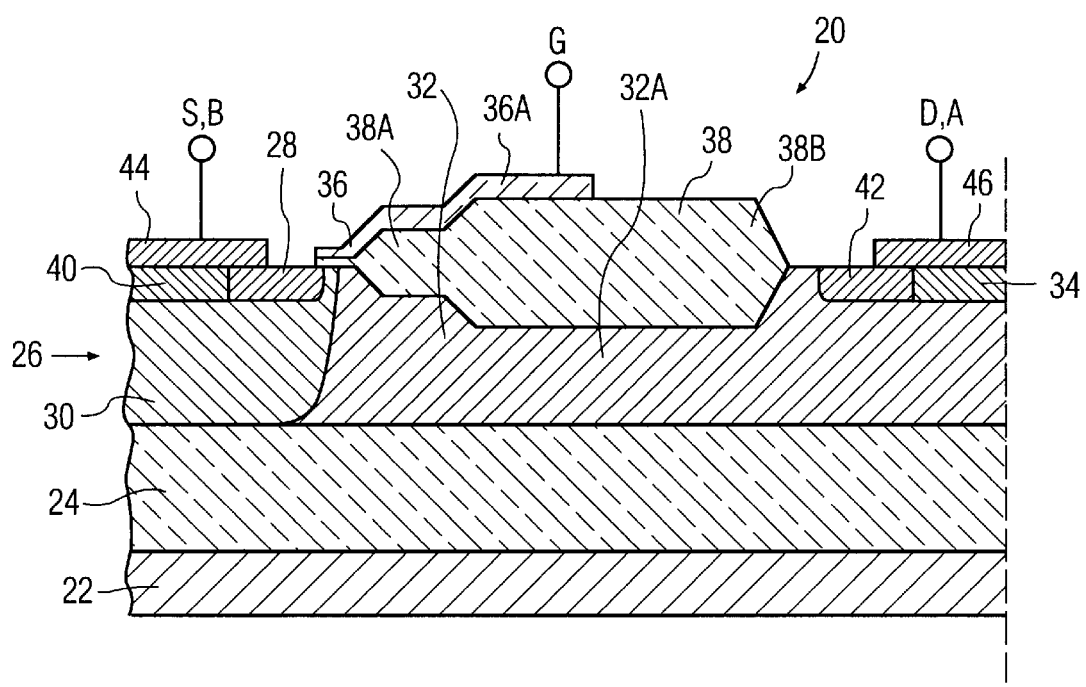
FIG. 2 shows a simplified cross-sectional view along the line 2—2 of FIG. 1.

In the simplified cross-sectional view of FIG. 2, taken along the line 2—2 in FIG. 1, an SOI LIGBT device 20 includes a semiconductor substrate 22, a buried insulating layer 24, and a semiconductor surface SOI layer 26 in which the device is fabricated. The LIGBT device includes a source region 28 of one conductivity type (typically n type), a body region 30 of a second, opposite conductivity type, a lateral drift region 32 of the first conductivity type which forms a lightly-doped drain region, and a drain contact region 34, also of the first conductivity type. The device structure also includes a gate electrode 36, which is insulated from the underlying semiconductor surface layer 26 by an oxide surface insulation region 38. Within the scope of the invention, the LIGBT device which serves as the starting point for the present invention may have various performance-enhancing features, such as a linear lateral doping profile, a stepped oxide region 38A, 38B, an extended gate electrode structure forming a field plate portion 36A, and a thinned lateral drift region portion 32A, all as detailed in the prior art, or other performance-enhancing features as desired, without departing from the spirit or scope of the invention. Additionally, the LIGBT device 20 includes a surface body contact region 40, adjacent to source region 28, located in the body region 30 and of the same conductivity type as the body region but more highly doped, and an anode region 42 of the second conductivity type in the drain region and in contact with drain contract region 34.

The simplified device structure shown in FIG. 2 is completed by a source and body region contact 44, which connects the source region 28 and surface body contact region 40 together (preferred, but not mandatory) and also provides an external electrical connection to the device. Similarly, a drain and anode region contact 46 is provided to connect the drain contact region 34 and the anode region 42 together, and also to provide an external connection to this portion of the device. It should be noted that by providing contacts 44 and 46 in the manner described above, a "shorted anode" (or "shorted drain") configuration is achieved, effectively providing the equivalent of an LDMOST device and an LIGBT device connected directly in parallel. In this manner, a device structure is achieved in which the performance advantages of both types of devices are realized.

An additional feature of the invention is shown in FIG. 1, in which a simplified plan view of the device of FIG. 2 is shown. In this figure, in which the uppermost layers of metallization and oxide are not shown for reasons of clarity, it can be seen that the device is formed by a plurality of concentric regions, shown here as concentric circles, although it should be emphasized that other shapes, such as squares, hexagons, or the like, are within the scope of the invention. The various closed, concentric regions of the device are centered about the drain contact region 34, and include, successively, anode region 42, lateral drift region 32, body region 30, source region 28, and body contact region 40. In accordance with the invention, whatever the shape of the closed concentric regions, a dimension of the source region (here its circumference) in a direction normal to a direction of current flow between the source region and the drain contact region (here radial) is greater than a corresponding dimension (here circumference) of the drain contact region and of the anode region. Thus, it can be clearly seen in FIG. 1 that the circumference of source region 28 is greater than the circumference of drain contact region 34 and of anode region 42.

In accordance with the invention, the foregoing structural features substantially enhance on-state performance of the device. Since the invention essentially provides an LIGBT device in parallel with an LDMOST device, the resulting structure will behave like an LDMOST device at low drain bias, thus achieving enhanced switching characteristics, and will behave like an LIGBT device at higher drain bias, thus achieving the advantage of improved saturation current and on-state performance. Furthermore, the use of a closed concentric geometry permits the circumference (or length) of the source region to be greater than that of the drain region, thus resulting in current crowding and a higher current density at the drain region for the same drain bias. This higher current density results in a lowering of the drain bias required to initiate bipolar conduction and also produces a greater conductivity modulation of the drift region, thus further improving on-state performance and enhancing saturation current. While it has been found that the circular device configuration, as shown in FIG. 1, is a preferred embodiment, it will be understood that other shapes, such as concentric squares or hexagons, may alternatively be employed within the scope of the invention. Furthermore, it should be noted that the saturation current enhancement effect of the present invention is particularly significant in SOI devices in which the drift region doping profile is linearly graded, since hole injection efficiency and conductivity modulation would otherwise be poor in such devices. To quantify the improvement achieved by the present invention, a 650 volt shorted-anode LIGBT SOI device with a circular topology can exhibit a saturation current enhancement up to a factor of about 7 as compared to conventional prior-art devices.

It should also be emphasized that devices in accordance with the present invention can be made using completely standard process technology, similar to that used for fabricating conventional LIGBT and LDMOS devices. Additionally, it should be noted that the improved current gain and current density provided by structures in accordance with the present invention allow the designer greater flexibility in that devices designed for a particular level of performance can be made substantially smaller than comparable prior-art devices, or that substantially improved device performance can be achieved within a given device area.

Finally, it should be noted that while only a single device is shown for illustrative purposes, it will be understood that commercial products incorporating the invention may include a plurality of such devices connected in parallel and formed adjacent to each other in a manner well-known in the art in order to achieve a higher current capacity.

It will be understood that the simplified, representative device shown in the Figures depicts a particular device structure, but that wide variations in both device geometry and configuration can be used within the scope of the invention. Additionally, the present invention may be incorporated into various different types of high-voltage LIGBT devices having different structures in other respects, well-known to those skilled in this art.

In the foregoing manner, the present invention provides an LIGBT SOI device structure capable of high performance in a high-voltage, high-current environment, while enhancing operating and fabrication parameters and in particular on-state performance (saturation current) and/or reduced area.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A lateral thin-film Silicon-On-Insulator (SOI) device comprising a semiconductor substrate, a buried insulating layer on said substrate, and a Lateral Insulated Gate Bipolar Transistor (LIGBT) device in an SOI layer on said buried insulating layer and having a source region of a first conductivity type formed in a body region of a second conductivity type opposite to that of the first, a body contact region of said second conductivity type in said body region and adjacent to said source region, a lateral drift region of said first conductivity type adjacent said body region and forming a lightly-doped drain region, a drain contact region of said first conductivity type and laterally spaced apart from said body region by said lateral drift region, an anode region of said second conductivity type in said drain region and connected to said drain contact region, and a gate electrode over a part of said body region in which a channel region is formed during operation and extending over a part of said lateral drift region adjacent said body region, said gate electrode being insulated from said body region and drift region by a surface insulation region, wherein a dimension of said source region in a direction normal to a direction of current flow between said source region and said drain contact region is greater than a corresponding dimension of said drain contact region and of said anode region.

2. A lateral thin-film Silicon-On-Insulator (SOI) device as in claim 1, wherein said drain contact region, said anode region and said source region comprise closed, concentric regions centered about said drain contact region.

3. A lateral thin-film Silicon-On-Insulator (SOI) device as in claim 2, wherein said closed concentric regions comprise circular-shaped regions.

4. A lateral thin-film Silicon-On-Insulator (SOI) device as in claim 1, wherein a plurality of said LIGBT devices are formed adjacent to each other in said SOI layer and are connected in parallel.

5. A lateral thin-film Silicon-On-Insulator (SOI) device as in claim 1, wherein the lateral drift region has a linearly-graded doping profile.

* * * * *